(12) United States Patent
Ushiki et al.

(10) Patent No.: US 6,837,936 B2
(45) Date of Patent: Jan. 4, 2005

(54) SEMICONDUCTOR MANUFACTURING DEVICE

(75) Inventors: Takeo Ushiki, Tokyo (JP); Keizo Yamada, Tokyo (JP); Yousuke Itagaki, Tokyo (JP)

(73) Assignee: Fab Solutions, Inc., Kanagawa (JP)

( * ) Notice: Subject to any disclaimer, the term of this patent is extended or adjusted under 35 U.S.C. 154(b) by 170 days.

(21) Appl. No.: 10/078,357

(22) Filed: Feb. 21, 2002

(65) Prior Publication Data
US 2002/0118348 A1 Aug. 29, 2002

(30) Foreign Application Priority Data
Feb. 23, 2001 (JP) ........................................ 2001-048038

(51) Int. Cl.[7] ............................................. C23C 16/00
(52) U.S. Cl. ...................... 118/713; 118/715; 118/719; 118/729; 422/110
(58) Field of Search .................................. 118/713, 715, 118/719, 728, 729; 422/110, 112

(56) References Cited

U.S. PATENT DOCUMENTS

| | | | | |
|---|---|---|---|---|
| 6,224,679 B1 | * | 5/2001 | Sasaki et al. | 118/719 |
| 6,383,897 B2 | * | 5/2002 | Mikata | 438/479 |
| 6,524,650 B1 | * | 2/2003 | Shimahara et al. | 427/248.1 |
| 6,616,898 B2 | * | 9/2003 | Hara et al. | 422/112 |

FOREIGN PATENT DOCUMENTS

JP          5-55330          3/1993

* cited by examiner

Primary Examiner—M. Wilczewski
(74) Attorney, Agent, or Firm—Neil A. Steinberg

(57) ABSTRACT

The semiconductor manufacturing device according to the present invention having a mechanical drive part which is moved in a vacuum device while holding a substrate includes at least one discharge port for introducing an inert gas into the vacuum device, and a flow rate control part for controlling the inert gas which is discharged into the vacuum device from the discharge port at a constant flow rate.

28 Claims, 2 Drawing Sheets

SEMICONDUCTOR MANUFACTURING DEVICE

BACKGROUND OF THE INVENTION

1. Field of the Invention

The present invention relates to a semiconductor manufacturing device, and more particularly to a semiconductor inspecting device or a semiconductor exposure device equipped with a mechanical drive part for moving, or rotating and tilting a substrate, such as a semiconductor substrate or a glass substrate, within a vacuum device while holding the substrate.

2. Description of the Prior Art

Accompanying a rapid advancement in the refinement of the minimum dimension of semiconductor devices from 0.13 μm to 0.10 μm or less, an electron beam exposure device or an X-ray exposure device has become to be adopted for lithography process, and the semiconductor substrate is being subjected to exposure process in a vacuum atmosphere. Besides, in a semiconductor inspection device, apparatuses employing electron beams or X-rays are being introduced in order to enhance the spatial resolution.

One item common to these semiconductor devices is that in both cases the stage portion holding the substrate is moved, or rotated or tilted as may be needed, in a vacuum atmosphere. The most serious problem in the manufacturing process or the inspection process is deterioration in the yield due to generation of defective products caused by the attachment of molecular or clustered chemical substances to the surface of the substrate in such a process.

A means of solving the problem is to absolutely block the attachment of the molecular or clustered chemical substances to the substrate in the manufacturing or the inspection process.

Now, when an oil diffusion pump is used in the vacuum evacuation system, oil components diffuse backward from the pump to the reaction chamber and attach to the substrate by such actions as the divergence of oil vapor, re-evaporation of condensed oil from the inner wall of the cylinder, and evaporation of the lighter components due to thermal decomposition of oil. Moreover, if grease with high volatility is used, components with high vapor pressure existing in the grease evaporate in the vacuum atmosphere, and attach themselves to the surface of the substrate. For these reasons, in the conventional semiconductor manufacturing device or semiconductor inspection device having a mechanical drive part for moving, or rotating or tilting a semiconductor substrate or a glass substrate in a vacuum device, employment of a pump with smaller amount of used oil or use of grease with lower vapor pressure, or the like has been devised so as to block the attachment of the chemical substances, and has been considered that a sufficient effect has been achieved.

The advancement of refinement of semiconductor elements has drastically changed the semiconductor manufacturing processes, and as a result, the methods which have been adopted in the past, namely, the use of a pump with smaller amount of oil and the use of grease with lower vapor pressure, are being proven to be no longer sufficient. This is because, in view of the current technical common knowledge that the permissible amount of impurities attaching to the surface of the substrate in the semiconductor manufacturing process is limited to below about $1 \times 10^{10}$ [atoms/$cm^2$], hydrocarbon based substances which are the principal components of the grease that attach themselves to the surface of the substrate is in an amount beyond the allowable amount mentioned above, in a vacuum device using a representative grease (for example, grease having the vapor pressure of 0.6 Torr at 200° C.).

Attachment of such oil and grease components to the surface of the substrate causes a serious problem of degradation in the product yield. For example, there is generated a pattern defect due to nonuniform coating of a photo resist in the plane of the wafer when the photo resist is spin coated, or there is caused a pattern defect called residue due to nonuniform etching of the plane of the wafer in the etching process. In addition, amine component in the molecular or clustered chemical substances attached to the surface of the substrate may cause a pattern defect by affecting the photochemical reaction of the photo resist.

In any case, as a result of a drastic increase in the number of semiconductor manufacturing processes of a semiconductor manufacturing device that employs electron beams or X rays, and a drastic increase in the number of the so-called in-line inspection processes that return the substrates after inspection that uses a semiconductor inspection device employing electron beams or X rays, attachment of molecular or clustered chemical substances to the surface of the substrates has become to seriously affect the deterioration in the yield of the products.

However, it is impossible not to introduce grease which is a supply source of molecular or clustered chemical substances to the surface of the substrate into the semiconductor manufacturing device or the semiconductor inspection device having a mechanical drive part for moving, or rotating or tilting the semiconductor substrate or the glass substrate within the device. The reason for this is that the use of grease which plays the role of a lubricant or a cooling material is indispensable in order to provide a high accuracy of stopping position to the mechanical drive part that holds the semiconductor substrate or the glass substrate.

As an attempt to solve this problem a method is proposed to heat the semiconductor substrate prior to semiconductor substrate processing in the vacuum device or following the processing of the semiconductor substrate (Japanese Patent Applications Laid Open, No. H5-55330. This method is based on the idea of evaporating the molecular or clustered chemical substances attached once to the surface of the semiconductor substrate, namely, to return the surface of the semiconductor substrate contaminated once to clean state again by subjecting the semiconductor substrate to heating.

However, in order to eliminate the degradation in the yield of the products due to the employment of a semiconductor manufacturing device or a semiconductor inspection device that employs electron beams or X rays, it is necessary to absolutely exclude the attachment of molecular or clustered chemical substances to the surface of the semiconductor substrate within the semiconductor manufacturing device or the semiconductor inspection device, from the beginning to the end of the processing procedures.

BRIEF DESCRIPTION OF THE INVENTION

Object of the Invention

It is the object of the present invention to provide a semiconductor manufacturing device which does not allow the attachment of molecular or clustered chemical substances to the surface of the semiconductor substrate.

Summary of the Invention

The semiconductor manufacturing device according to the present invention having a mechanical drive part which is moved within the vacuum device while holding the semiconductor substrate includes at least one discharge port for introducing inert gas into the vacuum device, and a flow rate control part which controls the inert gas flowing into the vacuum device from the discharge port at a constant rate.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figures 1, 2:
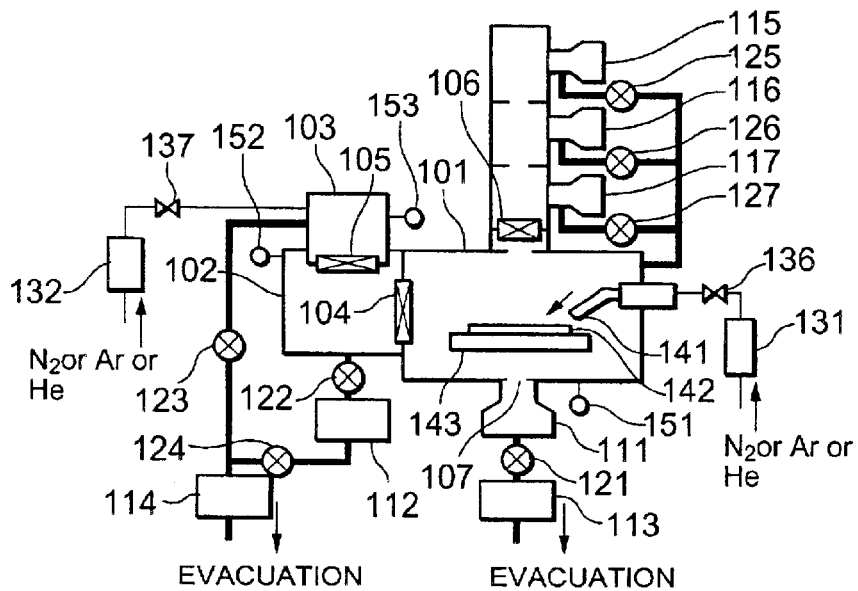
FIG. 1 is a schematic diagram showing the evacuation system of a semiconductor inspection device according to a first embodiment of this invention.
FIG. 2 is a comparative diagram for analyzing the amounts of adsorbed substances to the surface of a silicon substrate when a semiconductor inspection device according to the first embodiment of the invention and a conventional semiconductor inspection device are used.

Referring to the drawings, the embodiments of the present invention will be described. In a semiconductor inspection device provided with a mechanical drive part (143 in FIG. 1) for sequentially inspecting a plurality of inspection regions on a substrate by the repetitive action of motion and stop in a vacuum device while holding the substrate and an inspection processing part for inspecting the substrate under a controlled degree of vacuum, the semiconductor inspection device according to the invention includes at least one discharge port (141 in FIG. 1) which introduces inert gas into the vacuum device, and a flow rate control part (131 in FIG. 1) which controls the flow rate of the inert gas that is discharged from the discharge port into the vacuum device. With this arrangement, molecular or clustered chemical substances derived from grease found in the mechanical drive part more than in other places in the vacuum device are moved efficiently toward a vacuum exhaust port by the diffusion or flow of an ultrahigh-clean inert gas (for example, $N_2$, or Ar or He) introduced into the vacuum device. Accordingly, it becomes possible to prevent the molecular or clustered chemical substances from adhering to the surface of the semiconductor substrate or the glass substrate that is held in the mechanical drive part. At the same time, since the use of grease in the mechanical drive part is thus enabled, it is possible to install a substrate holding stage with high accuracy of stopping position in a semiconductor inspection device (including the case of a semiconductor exposure device). As a result, it is possible to execute semiconductor inspection processes or semiconductor exposure processes dealing with extremely fine structures by employing electron beams or X rays.

Figure 4:
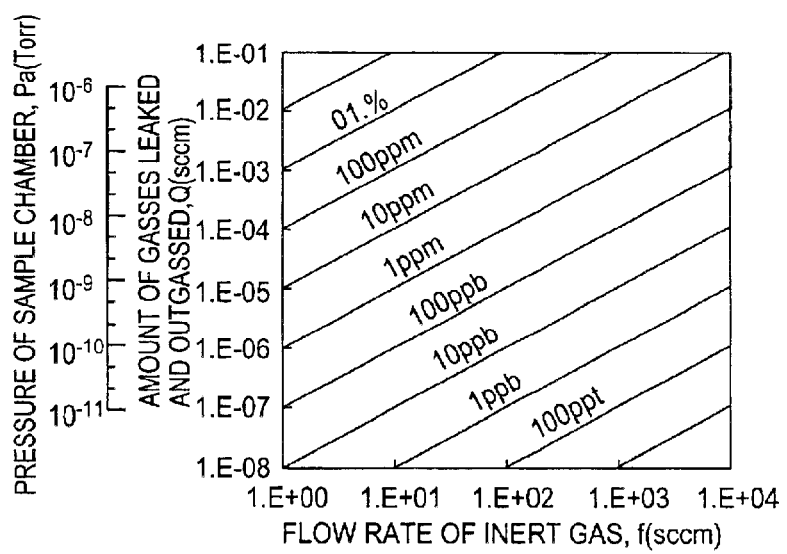
FIG. 4 is a graph showing the relation between the degree of vacuum in a sample chamber and the flow rate of ultra high-clean inert gas introduced into the sample chamber as to the cleanliness of the sample chamber having a mechanical drive part in vacuum atmosphere.

Here, the cleanliness of the sample chamber in which the mechanical drive part is located will be described. FIG. 4 is a graph showing the relation between the cleanliness of the sample chamber in which the mechanical drive part is located in the vacuum atmosphere, and the flow rate of the ultrahigh-clean inert gas discharged into the sample chamber. Here, as an example of vacuum evacuation of the sample chamber, a pump with displacement of 1,000 L/s is used. The cleanliness of the sample chamber can be defined by (Cleanliness of the Sample Chamber)=$Q \div (Q+f)$, where Q [sccm] is the amount of gasses leaked and outgassed, and f[sccm] is the flow rate of the ultrahigh-clean inert gas discharged into the sample chamber.

Moreover, the following relation $Q = 78.9 \times PB \times S$ holds among the amount of gasses leaked and outgassed Q[sccm], displacement S[L/s] of the pump displacement and the pressure PB[Torr] of the sample chamber.

Clearly, in order to enhance the cleanliness in the sample chamber, it is necessary to increase the degree of vacuum through improvement of surface treatment in the sample chamber or decrease the amount of gasses leaked or degassed into the sample chamber through the use of materials and components that have extremely small amount of discharge of molecular or clustered chemical substances, as well as to introduce a large amount of ultrahigh-clean inert gas. In other words, it is needed to use a pump with larger displacement capacity under an atmosphere of high degree of vacuum.

Referring to the drawings, a first embodiment of this invention will be described in more detail.

In the invention, a sample chamber 101 for measurement is under a vacuum atmosphere, and fine patterns are inspected by a mechanical drive part 143 for all inspection regions on a substrate 142 by sequential inspection of a plurality of inspection regions on the substrate through repeated action of motion and stop while holding the substrate such as semiconductor substrate or glass substrate, in the chamber.

This invention includes the sample chamber 101, a sample replacement chamber 103 and a loader chamber 102.

The sample chamber is a chamber for making measurement under a vacuum atmosphere, and has a vacuum exhaust port 107, an inert gas discharge port 141 and the mechanical drive part 143. The vacuum exhaust port 107 is formed in the lower part of the wall of the sample chamber 101 and is used for discharging gas within the sample chamber 101 by means of a vacuum device (a turbo molecular pump 111 and a screw pump 113). The inert gas discharge port 141 is a port arranged at a position in the vicinity of, but not making contact with, the substrate 142 for introducing inert gas at a controlled flow rate into the sample chamber 101. The mechanical drive part 143 is located between the inert gas discharge port 141 and the vacuum exhaust port 107 in the sample chamber 101 and performs repeated action of motion and stop. The total displacement of the turbo pump 111 connected to the sample chamber 101 is 1,000 [L/s].

The sample replacement chamber 103 is a chamber for bringing-in and -out a substrate, the substrate set in this chamber is subjected to a preliminary evacuation by a screw pump 114 and then is transported to the loader chamber 102 adjusted to an appropriate degree of vacuum, by opening a lock valve 105, and the lock valve 105 is closed after transportation.

The loader chamber 102 is a chamber for adjusting its vacuum degree to that of the sample chamber 101, where the substrate brought in from the sample replacement chamber 103 is to be transported into the sample chamber 101 by opening a lock valve 104, when the chamber 102 is evacuated to a degree comparable to that of the sample chamber 101, and is placed on the mechanical drive part 143 in the sample chamber.

Next, an experiment using the semiconductor inspection device according to the first embodiment of this invention and a standard electron microscope device (conventional example) will be described.

The experiment is carried out as in the following. First, two sheets of 8-inch silicon wafer are subjected to a series of normal cleaning processes in the semiconductor manufacture that employs sulfuric acid-hydrogen peroxide, ammonium-hydrogen peroxide, and pure water to bring the surface of the silicon wafer to be free from organic substances and alkali metals.

Next, one sheet of silicon wafer is left standing for about 1 hour in the sample chamber 101 of the semiconductor manufacturing device according to this embodiment. The degree of vacuum in the sample chamber 101 at this time is about $10^{-5}$ Torr, and the flow rate of the ultrahigh-clean inert gas flowing into the sample chamber 101 through the inert gas discharge port 141 is 5 sccm. The silicon wafer obtained in this way is used as an implementation product.

In the mean time, the other silicon wafer sheet is left standing for the same length of time of about 1 hour in the standard electron microscope device (a device less the inert gas discharge port 141 and the remaining is the same as in FIG. 1). In other words, it corresponds to the condition that the flow rate of the unltahigh-clean inert gas that flows into the sample chamber is essentially 0 sccm. The degree of vacuum in the sample chamber in this case is also about $10^{-5}$ Torr, the same as in the above. The silicon wafer obtained in this way is used as the conventional product.

Next, for the respective silicon wafers of the implementation product and the conventional product, the surface adsorbed substances are measured using the time of flight secondary ion mass spectroscopy. The conditions for the analysis are as listed in the following: ion species: as indicated in the figure, acceleration energy: 25 keV, ion current: 1.2 pA, angle of incidence: 45 degrees, mode: hunting, repetitive measurement: 10 kHz, electrification correction: none, and analysis area: 100 $\mu m^2$.

FIG. 2 is a comparative diagram showing the result of analysis of the amount of chemical substances adsorbed to the surface of the silicon substrate when use is made of the semiconductor inspection device according to the first embodiment of this invention and the semiconductor inspection device according to the conventional technology. In the silicon wafer of the implementation product, the amounts of the hydrocarbon compounds adsorbed to the surface of the substrate is markedly reduced compared with the case of the silicon wafer of the conventional product for all kinds of the substance. In this manner, the present embodiment can suppress the adsorption of chemical substances to the surface of the substrate.

In the semiconductor inspection device (FIG. 1) according to the first embodiment, the mechanical drive part 143 placed in the sample chamber which is kept under vacuum atmosphere is given a function of repeating motion and stop while holding the substrate 142 in order to sequentially inspect a plurality of inspection regions of the substrate 142. However, the mechanical drive part 143 may further be endowed with the function of performing rotation or tilting while holding the substrate 142. This is because there will be no essential change in the system diagram of the exhaust system of the device as shown in FIG. 1 even if the operation mechanism of the mechanical drive part is modified. In such a case, since the surface of the substrate can also be kept free from molecular or clustered chemical substances during the manufacturing processing, it is possible to enhance the accuracy of the semiconductor manufacturing processes that employs electron beams or X rays.

Next, referring to the drawings, a second embodiment according to the present invention related to a semiconductor exposure device will be described. Although a semiconductor exposure device has specifications of an electron gun and a lens, operation control method of a mechanical drive part, or the like that are somewhat different from those of a semiconductor inspection device, the system diagram for the exhaust system of the semiconductor exposure device is basically identical to the diagram for the exhaust system (FIG. 1) of the semiconductor device according to the first embodiment, namely, the function that the mechanical drive part that holds the substrate repeats motion and stop in a vacuum atmosphere during the operation is essentially identical to that of the embodiment 1.

Referring to FIG. 1, the semiconductor exposure device also has a mechanical drive part 143 for sequentially inspecting a plurality of inspection regions on a substrate 142 of semiconductor substrate or a glass substrate by an action that repeats motion and stop while holding the substrate within a sample chamber 101 for measurement. An inert gas discharge port is located in the vicinity of the substrate 142, the mechanical drive part 143 is located between the inert gas discharge port 141 and a vacuum exhaust port 107, inert gas is introduced into the sample chamber 101 at a controlled flow rate from the inert gas discharge port 141, and measurement is taken under a controlled vacuum degree. In this semiconductor exposure device, the substrate is transported to a loader chamber after preliminary evacuation of a sample replacement chamber 103, Then, it is transported to the sample chamber when the loader chamber is evacuated to a vacuum degree comparable to that of the sample chamber using a turbo molecular pump 112 and a screw pump 114, to be placed on the mechanical drive part 143. Here, the total displacement of the turbo molecular pump 112 is 1,000 [L/s]. Next, an experiment using the semiconductor exposure device according to the second embodiment and the standard electron microscope (conventional example) will be described.

The experiment is performed in the following manner. First, two sheets of 8-inch silicon wafers are subjected to the normal cleaning processes in the semiconductor manufacture which employs sulfuric acid-hydrogen peroxide solution, ammonium-hydrogen peroxide solution and pure water. With this operation, the surface of the silicon wafer is made free from organic substances and alkali metals.

Next, one of the silicon wafers is left standing for about 1 hour in the sample chamber 101 of the semiconductor exposure device according to this embodiment. In this case, the degree of vacuum inside the sample chamber 101 is about $10^{-2}$ Torr, and the flow rate of the superhigh-clean inert gas that is introduced into the sample chamber 101 through the inert gas discharge port 141 is 100 sccm. The silicon wafer obtained in this manner is used as an implementation product.

In the meantime, the other silicon wafer is left standing similarly for 1 hour in a standard electron microscope device (the device in FIG. 1 less the inert gas discharge port 141, with the remaining the same). In other words, the flow rate of the ultrahigh-clean inert gas that is introduced into the sample chamber 101 corresponds practically to the condition of 0 sccm. The degree of vacuum inside the sample chamber in this case has the same value of about $10^{-2}$ Torr. The silicon wafer obtained in this way is used as a conventional product.

Next, the amount of substances adsorbed to the surface of the silicon wafer is measured by the time of flight secondary ion mass spectrometry for respective silicon wafers of the implementation product and the conventional product. The conditions of the analysis are as follows: ion species: as indicated in the figure, acceleration energy: 25 keV, ion current; 1.2 pA, angle of incidence: 45 degrees, mode: hunting, repetition measurement: 10 kHz, electrification correction: none, and analysis area: 100 $\mu m^2$.

Figure 3:
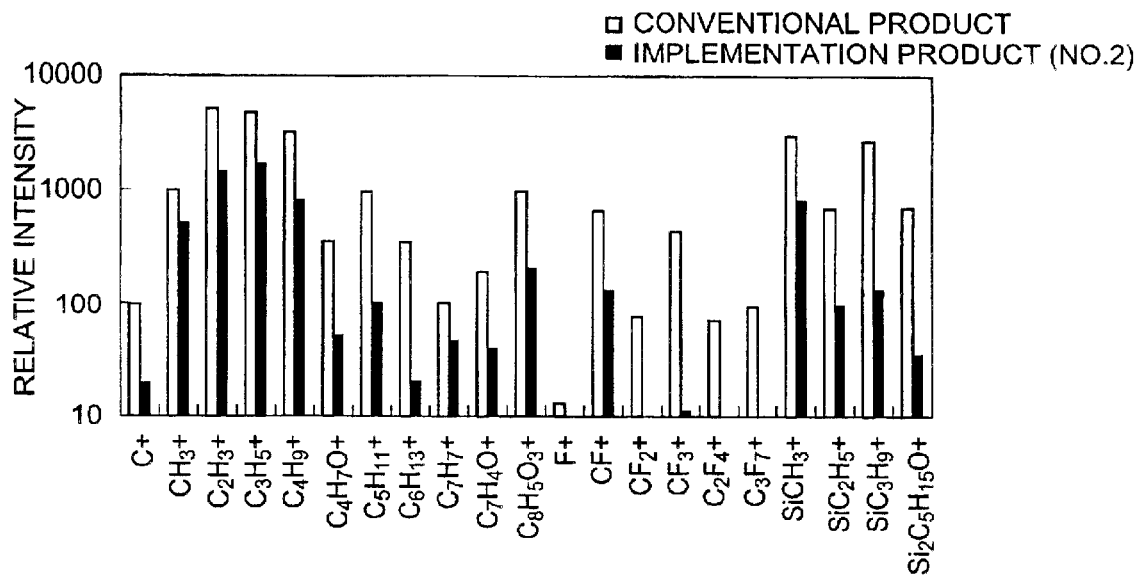
FIG. 3 is a comparative diagram for analyzing the amounts of adsorbed substances to the surface of the silicon substrate when the semiconductor exposure device according to a second embodiment of the invention and the conventional semiconductor exposure device are used.

The result of the measurement is shown in FIG. 3, where the analysis of the amounts of substances adsorbed to the surface of a silicon substrate are compared for the cases of using the semiconductor exposure device according to the second embodiment of this invention and the semiconductor exposure device according to the conventional method. As shown in the figure, in the silicon wafer of the implementation product, the amount of the hydrocarbon adsorbed to the surface of the substrate is reduced markedly compared with the case of the conventional product for all kinds of hydrocarbon compounds. In this manner, according to the present embodiment it is possible to suppress the adsorption of chemical substances to the surface of the substrate.

In the second embodiment, the mechanical drive part 143 in the sample chamber 101 kept under vacuum atmosphere is provided with a function to repeat motion and stop while holding the substrate 142 in order to sequentially inspect a plurality of inspection regions on the substrate 142. However, the mechanical drive part 143 may be given a function of either moving or rotating or tilting the substrate 142 while holding it. This is because the system diagram for an exhaust system for the device such as shown in FIG. 1 remains essentially identical even if the operating mechanism of the mechanical drive part is changed. In such a case, since attachment of molecular or clustered chemical substances to the surface of the substrate during the manufacturing processing can be suppressed markedly, it is possible to enhance the accuracy of the semiconductor manufacturing process that employs electron beams or X rays.

In either case of the first embodiment and the second embodiment, the manufacturing method is feasible provided that the total exhaust rate of the vacuum pump group connected to the vacuum device lies in the range between 300 and 5,0000 L/s. Moreover, the degree of vacuum within the vacuum chamber and the flow rate of the inert gas need be in the ranges of between $133 \times 10^{-7}$ to $133 \times 10^{-4}$ kPa and between 0.5 to 20 $cm^3$/min, respectively.

According to the present invention, the manufacturing process or the inspection process can be executed with drastically reduced attachment of molecular or clustered chemical substances to the surface of the substrate, and as a result, it is possible to improve the productivity of the semiconductor products.

Moreover, grease can be used in the mechanical drive part, so that it is possible to employ a substrate hold stage with high accuracy of stopping position.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor manufacturing device comprising,
    a vacuum device;
    a mechanical drive part, wherein the mechanical drive part is capable of being moved in the vacuum device while holding a substrate;
    a discharge port to introduce inert gas into the vacuum device;
    a flow rate control part, coupled to the discharge port, to control a rate of flow of the inert gas into the vacuum device; and
    an inspection processing part capable of inspecting the substrate when the substrate is disposed in the vacuum device.

2. The semiconductor manufacturing device of claim 1 wherein the mechanical drive part is located between the discharge port and a vacuum exhaust port in the vacuum device.

3. The semiconductor manufacturing device in claim 1 wherein the mechanical drive part is adapted to translate, rotate of tilt the substrate.

4. The semiconductor manufacturing device of claim 1 further including a flow rate controller to control the flow of inert gas into the vacuum device.

5. The semiconductor manufacturing device of claim 4 wherein the mechanical drive part, while holding the substrate within the vacuum device, is capable of moving the substrate, relative to the inspection processing part, to permit sequential inspection of a plurality of regions of the substrate by the inspection processing part.

6. A semiconductor manufacturing device comprising,
    a vacuum device;
    a mechanical drive part that is moved in the vacuum device while holding a substrate;
    a discharge port to introduce an inert gas into the vacuum device;
    a flow rate control part to control the inert gas that is discharged into the vacuum device from the discharge port at a constant flow rate; and
    a vacuum pump connected to the vacuum device wherein:
        the total evacuation rate of the vacuum pump connected to the vacuum device is more than 300 Liters per second and less than 5,000 Liters per second;
        the degree of vacuum within the vacuum device is higher than $133 \times 10^{-7}$ kilo Pascals and lower than $133 \times 10^{-4}$ kilo Pascals; and
        the flow rate of the inert gas is more than 0.5 $cm^3$ per minute and less than 20 $cm^3$ per minute.

7. The semiconductor manufacturing device of claim 6 wherein the mechanical drive part is located between the discharge port and a vacuum exhaust port in the vacuum device.

8. The semiconductor manufacturing device of claim 6 wherein the mechanical drive part is adapted to translate, rotate or tilt the substrate.

9. The semiconductor manufacturing device of claim 6 further including a flow rate controller to control the flow of inert gas into the vacuum device.

10. A semiconductor manufacturing device comprising:
    a vacuum chamber;
    a mechanical driver disposed in the vacuum chamber, wherein the mechanical driver is adapted to (i) hold a semiconductor substrate and (ii) translate, rotate or tilt the semiconductor substrate;
    a discharge port that introduces an inert gas into the vacuum chamber; and a flow rate controller, coupled to the discharge port, to control the flow of the inert gas through the discharge port.

11. The semiconductor manufacturing device of claim 10 wherein the flow rate controller provides a constant rate of rate of the inert gas into the vacuum chamber.

12. The semiconductor manufacturing device of claim 10 wherein the discharge port is positioned in the vicinity of the semiconductor substrate when the semiconductor substrate is located in the vacuum chamber during inspection.

13. The semiconductor manufacturing device of claim 10 further including an exhaust port in the vacuum chamber.

14. The semiconductor manufacturing device of claim 10 wherein the mechanical driver is positioned between the discharge port and the exhaust port.

15. The semiconductor manufacturing device of claim 10 further including an inspection processing part which is capable of inspecting the semiconductor substrate when the semiconductor substrate is disposed in the vacuum chamber.

16. The semiconductor manufacturing device of claim 15 wherein the mechanical driver, while holding the semiconductor substrate in the vacuum chamber, is capable of moving the semiconductor substrate, relative to an inspection processing part, to permit sequential inspection of a plurality of regions of the semiconductor substrate by the inspection processing part.

17. A semiconductor manufacturing device comprising:
a vacuum chamber;
an inspection part disposed in the vacuum chamber;
a mechanical driver disposed in the vacuum chamber, wherein the mechanical driver is capable of holding a semiconductor substrate in the vacuum chamber;
a discharge port that introduces an inert gas into the vacuum chamber; and
a flow rate controller, coupled to the discharge port, to control the flow of inert gas through the discharge port.

18. The semiconductor manufacturing device of claim 17 wherein the mechanical driver is adapted to translate, rotate or tilt the semiconductor substrate.

19. The semiconductor manufacturing device of claim 17 wherein the mechanical driver, while holding the semiconductor substrate in the vacuum chamber, is capable of moving the semiconductor substrate, relative to an inspection part, to permit sequential inspection of a plurality of regions of the semiconductor substrate by the inspection part.

20. The semiconductor manufacturing device of claim 17 wherein the flow rate controller provides a constant rate of rate of the inert gas into the vacuum chamber.

21. The semiconductor manufacturing device of claim 17 wherein the discharge port is positioned in the vicinity of the semiconductor substrate when the semiconductor substrate is located in the vacuum chamber during inspection.

22. The semiconductor manufacturing device of claim 17 further including an exhaust port in the vacuum chamber.

23. The semiconductor manufacturing device of claim 22 wherein the mechanical driver is positioned between the discharge port and the exhaust port.

24. The semiconductor manufacturing device of claim 22 further including a vacuum pump connect to the exhaust port.

25. The semiconductor manufacturing device of claim 24 wherein the vacuum pump includes an evacuation rate of between 300 liters per second and 5,000 liters per second.

26. The semiconductor manufacturing device of claim 24 wherein the flow rate controller controls the flow of inert gas through the discharge port to be above 0.5 $cm^3$ per minute.

27. The semiconductor manufacturing device of claim 24 wherein the flow rate controller controls the flow of inert gas through the discharge port to be below about 20 $cm^3$ per minute.

28. The semiconductor manufacturing device of claim 24 wherein the vacuum is above about $133 \times 10^{-7}$ kiloPascals and below about $133 \times 10^{-4}$ kiloPascals.

* * * * *